US011183258B1

(12) United States Patent
Londak et al.

(10) Patent No.: US 11,183,258 B1
(45) Date of Patent: Nov. 23, 2021

(54) CIRCUIT AND METHOD FOR PROGRAMMING A ONE-TIME PROGRAMMABLE MEMORY

(71) Applicant: SEMICONDUCTOR COMPONENTS INDUSTRIES, LLC, Phoenix, AZ (US)

(72) Inventors: Pavel Londak, Hutisko Solanec (CZ); Petr Hlavica, Kelc (CZ); Pavel Latal, Vigantice (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/247,282

(22) Filed: Dec. 7, 2020

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ...................................................... G11C 17/18
USPC .......................................................... 365/96
See application file for complete search history.

(56) References Cited

U.S. PATENT DOCUMENTS

| 5,572,458 A * | 11/1996 | Smith | G11C 17/18 257/50 |
| 8,964,444 B2 * | 2/2015 | Hall | G11C 17/18 365/96 |
| 2008/0043508 A1 | 2/2008 | Chao et al. | |
| 2010/0265754 A1 * | 10/2010 | Saito | G11C 17/18 365/96 |
| 2012/0236624 A1 * | 9/2012 | Costa | G11C 11/5664 365/148 |
| 2014/0231895 A1 | 8/2014 | Rothleitner | |
| 2016/0196946 A1 | 7/2016 | Gan | |

OTHER PUBLICATIONS

Robert Zwingman, Jazz Semiconductor Application—Note, Feb. 1, 2012.*
ON Semiconductor, "NCP59748 Linear Regulator—Dual-Rail, Very Low-Dropout, Programmable Soft-Start 1.5 A," Oct. 2019.*

* cited by examiner

*Primary Examiner* — Muna A Techane
(74) *Attorney, Agent, or Firm* — Brake Hughes Bellermann LLP (57) ABSTRACT

Programming a fuse for a one-time programmable (OTP) memory can require applying a programming current for a programming period to increase a resistance of the fuse. It may be desirable for the resistance to be very high. A very high resistance may be achieved by applying a high programming current to form a void in the fuse. Applying the high programming current too long after the void is formed, however, may lead to uncontrolled variations and ultimately damage. Accordingly, it may be desirable to end the programming period sometime after the void is formed but before the uncontrolled variations begin. Ideally the programming period is ended at a time at which the programming current is minimum. The disclosed circuits and method provide a means to estimate this time without requiring the complexity of sensing very low levels of programming current.

20 Claims, 5 Drawing Sheets

CIRCUIT AND METHOD FOR PROGRAMMING A ONE-TIME PROGRAMMABLE MEMORY

FIELD OF THE DISCLOSURE

The present disclosure relates to one-time programmable (OTP) memories and more specifically to a circuit and method for programming (i.e., blowing) a fuse of an OTP memory.

BACKGROUND

OTP memory may include a plurality of fuses. Each fuse may store a bit of information based on its conductivity (i.e., resistance). For example, a logical HIGH may be represented by a fuse having a higher conductivity (i.e., lower resistance), while a logical LOW may be represented by a fuse having a lower conductivity (i.e. higher resistance). Accordingly, the plurality of fuses may be programmed to store a data pattern, which can be retrieved (i.e., read-out) by sensing a conductance (i.e., a resistance) of each fuse.

OTP memory may be included in an integrated circuit to add versatility or security to the integrated circuit. For example, an integrated circuit may have an array of available features, parameters, and/or functions, and the OTP memory may be programmed to select a particular set of features, parameters, and/or functions. For proper operation, it may be important to reduce errors in programming. An error in programming can occur when a programmed fuse is sensed (i.e., read-out) as an unprogrammed fuse. Reducing errors in programming may depend on the circuit and method used for programming.

SUMMARY

In at least one aspect, the present disclosure generally describes a method for programming a fuse. The method includes controlling a switch device to allow a programming current to flow in a fuse at a start of a programming period. The method further includes monitoring a voltage corresponding to the programming current flowing in the fuse and detecting a change in the voltage. After the change in the voltage is detected, the method includes starting a baking period and controlling the switch device to prevent the programming current from flowing in the fuse at an end of the baking period so that the end of the baking period corresponds to an end of the programming period.

In a possible implementation of the method, a portion of the fuse is polysilicon at a start of the programming period and changes to amorphous silicon and includes a void at an end of the programming period.

In another aspect, the present disclosure generally describes a system for programming a fuse. The system includes a fuse and a closed loop programming control circuit. The fuse is coupled to a programming voltage at a first end and coupled to a transistor at a second end. The transistor is switched to an ON condition to start a programming period during which a programming current is allowed by the transistor to flow through the fuse. The closed loop programming control circuit is coupled at an input to the second end of the fuse and coupled at an output to a controlling terminal of the transistor. The closed loop programming control circuit includes a trigger circuit that is configured to generate a trigger signal upon detecting a programming condition corresponding to the fuse at the input. The closed loop programming control circuit further includes a delay circuit that is configured to delay the trigger signal from the trigger circuit for a baking period and a switch control circuit that is configured to receive a delayed trigger signal from the delay circuit. Upon receiving the delayed trigger signal, the switch control circuit is configured to switch the transistor to an OFF condition to end the programming period.

In another aspect, the present disclosure generally describes a closed loop programming control circuit. The closed loop programming control circuit includes a trigger circuit, a delay circuit, and a switch control circuit. The trigger circuit is configured to receive a voltage from a fuse during programming and to generate a trigger signal upon detecting a drop in the voltage from the fuse during programming to below a threshold level. The delay circuit is configured to delay the trigger signal from the trigger circuit for a baking period. The switch control circuit is configured to receive the delayed trigger signal from the delay circuit. Upon receiving the delayed trigger signal, the switch control circuit is further configured to transmit a signal to end programming of the fuse.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

A fuse for an OTP memory (i.e., OTP memory cell) can be implemented as a variable resistor including an input terminal (i.e., first end) and an output terminal (i.e., second end) that are coupled to a structure (e.g., layer, slab, etc.) including polysilicon and a layer of silicide on (i.e., contiguous with, adjacent to) the polysilicon. During programming, current may heat the structure and transform its resistance. Prior to programming, the polycrystalline silicon (polysilicon) may have a relatively low resistance. During programming, a programming current ($I_{PROG}$) may heat the polysilicon, transforming all or part of it to an amorphous silicon, having a higher resistance. In other words, the fuse may be substantially polysilicon at a start of a programming period and substantially amorphous silicon at an end of the programming period. The post-programmed (i.e., post-trimmed) resistance may be made even higher by further heating the amorphous silicon to produce a void in the structure. Too much heating, however, can refill the void and ultimately damage the fuse and/or surrounding structures. Obtaining a high resistance consistently through programming can be difficult. A period during programming that a resistance of the fuse is suitably high may be brief and may depend on the material, structure, process, and environment. Disclosed herein are circuits and methods to program fuses to a high resistance (e.g., ≥1 mega-ohm (MΩ)) consistently (e.g., ≤5% programming errors). The disclosed circuits and methods provide closed-loop control that automatically adapts to programming variations. For example, the disclosed circuits and methods can be applied to programing fuses of different technologies (e.g., 250 nanometer (nm), 180 nm) without change. Further, the disclosed circuits and method are based on ground referenced voltages making them suitable for use with low voltages (e.g., <5 volts (V)).

Programming (i.e., trimming) a fuse for OTP memory is non-reversible and results in a resistance increase from a pre-trimmed (i.e., pre-programmed, pre-blown) resistance to a post-trimmed (i.e., post-programmed, post-blown) resistance. For example, a pre-trimmed resistance may be less than 100 ohms (Ω), while a post-trimmed resistance may be greater than or equal to 1 MΩ. Variations in post-trimmed resistances may lead to errors in a sensing (i.e., read-out) of the OTP memory if not eliminated or otherwise compensated for. Compensating for possible variations can require redundant memories, which can consume die area and/or can place requirements on the programming method, which may be difficult to satisfy. Accordingly, it may be desirable to eliminate variations in post-trimmed resistances rather than compensating for the variations. The possible variability in post-trimmed resistances may be understood by considering an example programming of an example fuse using an example programming circuit.

A variety of programming circuits can be used to control the programming of the fuse. For example, a programming circuit may control a current flowing through a fuse during programming. In this implementation the voltage of the fuse can vary as the resistance of the fuse is changed by the current during programming. Alternatively, a programming circuit may control a voltage applied to a fuse during programming. In this implementation, the current flowing through the fuse can vary as the resistance of the fuse is changed by the voltage during programming. The disclosed circuits and methods control a voltage applied to a fuse during programming. This approach may be less complex than the current control method.

Figure 1:
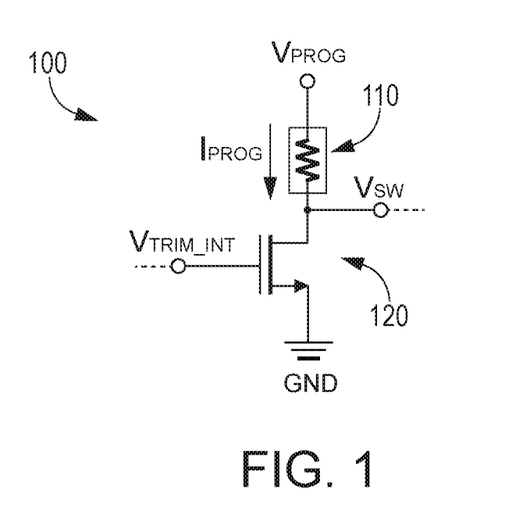
FIG. 1 is a schematic of a portion of a programming circuit according to a possible implementation of the present disclosure.

FIG. 1 is a schematic of a portion of a possible programming circuit according to an implementation of the present disclosure. The programming circuit 100 includes a fuse 110 that is coupled to a programming voltage ($V_{PROG}$). The programming circuit further includes a switching device in series with the fuse 110 and with a ground (GND). As shown in FIG. 1 the switching device can be a transistor 120, such as a n-type metal oxide semiconductor field effect (NMOS) transistor. A programming (i.e., trim interval) signal ($V_{TRIM\_INT}$) can be applied to a controlling terminal (e.g., a gate terminal) of the transistor 120 to configure the transistor in an ON condition (i.e., conducting) or an OFF condition (i.e., not conducting). For example, the programming signal may resemble a pulse and therefore may be referred to as a programming pulse. When the transistor is configured in the ON condition, a programming current ($I_{PROG}$) can flow through the fuse. A level of the programming current can be based on the programming voltage ($V_{PROG}$). A switch voltage ($V_{SW}$) at the transistor 120 of the programming circuit 100 can correspond to a resistance of the fuse 110. For example, at the beginning of a programming, a resistance of the fuse may be relatively low, leading to a switch voltage ($V_{SW}$) of an initial value that is relatively close to the programming voltage ($V_{PROG}$). As programming continues, the resistance of the fuse can increase so that the switch voltage ($V_{SW}$) drops from the initial value.

A plurality of fuses programmed using a fixed programming voltage applied for a fixed programming period may have a distribution of post-trimmed resistances. The distribution may be wide (e.g., have a large standard deviation) due to a variety of transition changes and/or structural changes that may result from a programming approach (i.e., programming protocol, programming method).

One possible programming method uses, a relatively low current (e.g., 25 milliamps (mA)) applied over a relatively long pulse (e.g., 5 microseconds (µs)). In this approach, the relatively low current may not generate enough heat to cause a structural change (i.e., void). While this approach may have an advantage of reducing variations and/or damage caused by structural changes, the low current density used in this programming approach can result in long programming times in order to create the material changes necessary to differentiate a post-trimmed fuse from a pre-trimmed fuse. Further, small variations in process, temperature, and/or $V_{PROG}$ over a long programming period may result in a wide distribution (e.g., 1 KΩ-1 MΩ) of post-trimmed resistances, and the post-trimmed resistances may be lower than desired.

A higher current density in the fuse is necessary to create a structural change to the fuse that can lead to a very high (e.g., 10 MΩ) post trimmed resistance. Keeping the programming period fixed and increasing the programming current can lead to variations from a variety of changes to the fuse and its structure. These changes are illustrated in the graphs of FIG. 2.

Figure 2:
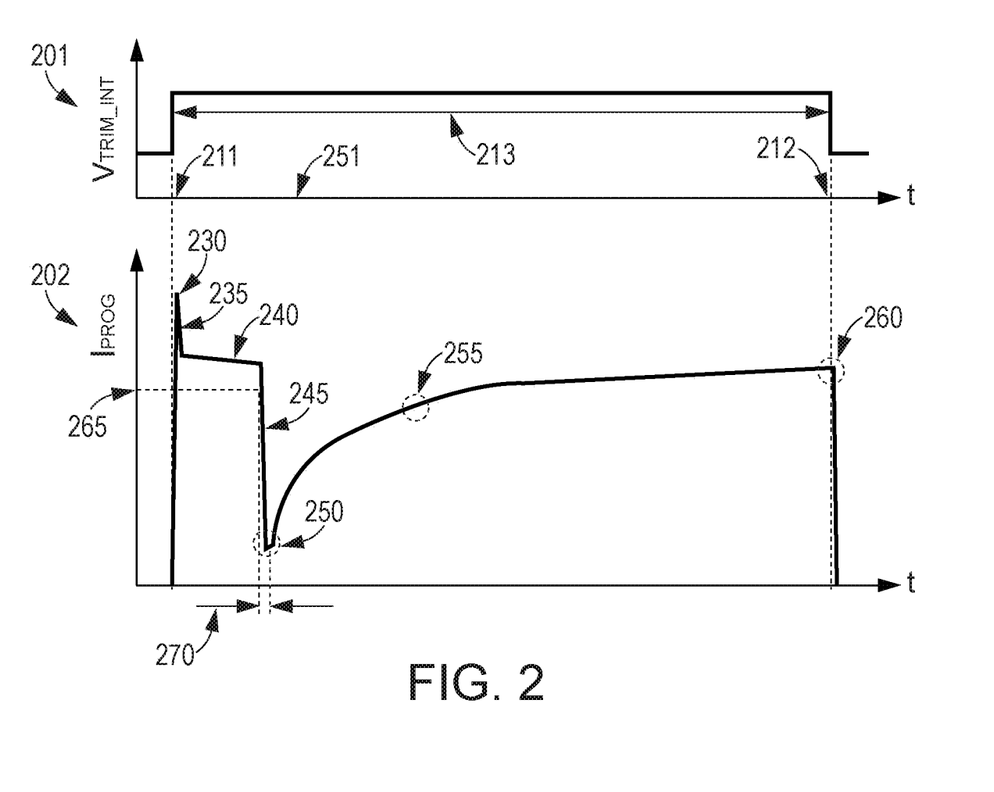
FIG. 2 are graphs showing signals from an example programming.

FIG. 2 are graphs showing signals from an example programming method applied to the programming circuit of FIG. 1. A first graph 201 illustrates a programming pulse applied to the transistor of the programming circuit, while a second graph 202, which has the same time axis as the first graph, illustrates the programming current ($I_{PROG}$). In the method, a programming voltage ($V_{PROG}$) is applied at or before a programming start time 211 and ended at or after a programming stop time 212. For example, the program voltage ($V_{PROG}$) may be a supply voltage ($V_{DD}$) of the circuit. At the programming start time 211, a programming signal transitions from a first state (i.e., LOW) to a second state (i.e., HIGH) to configure the transistor 120 of the programming circuit 100 in an ON (i.e., conducting) condition. When the transistor 120 is in the ON condition, the programming current ($I_{PROG}$) may flow through the fuse 110 to the ground (GND). At the programming stop time 212, a programming signal transitions from the second state (i.e., HIGH) to the first state (i.e., LOW) to configure the transistor 120 of the programming circuit 100 in an OFF (i.e., non-conducting) condition. When the transistor 120 is in the OFF condition, the programming current ($I_{PROG}$) may be substantially blocked (e.g., reduced by >99%) from flowing through the fuse 110 to the ground (GND). A period of time while the programming current ($I_{PROG}$) is allowed by the transistor to flow through the fuse is known as the programming period 213.

The second graph 202 of FIG. 2 illustrates that the programming current ($I_{PROG}$) quickly rises to a peak 230 (e.g., 40 mA) after the programming start time 211 of the programming period 213. After the peak 230, the programming current flows mostly in a silicide layer on the polysilicon and quickly heats the polysilicon material to its melting point. Upon melting, the programming current experiences a first transition 235 (i.e., first drop) due to the phase change. In the first transition 235, the programming current may quickly (e.g., 10 nanoseconds (ns)) transition from the peak 230 to a first plateau 240. During the first plateau 240 a reduced (e.g., 28 mA) programming current changes little as it flows through the silicide and the melted polysilicon (i.e., flows through the alloy). As the programming current is allowed to continue, electromigration of the melted alloy can be interrupted and a void may form in the fuse structure. The void may increase the fuse resistance by several orders of magnitude. Accordingly, the programming current may experience a second transition 245 (i.e., second drop) due to the void formation Like the first transition, in the second transition 245, the programming current may quickly (e.g., 10 ns or less) transition from the first plateau 240 to a second plateau 250. During the second plateau, the programming current may continue to flow. For example, a portion of the programming current may flow through conductive filaments spanning the void (e.g., extending across the void, in the direction of the current). The programming current will eventually reach a minimum value at a minimum time 251 ($t_{MIN}$) during the second plateau 250 as some or all of the filaments are burned (i.e., baked) away.

A level of a programming current can correspond to an amount of heating power applied to the fuse. For example, a higher programming current can correspond to a higher heating power. Accordingly, a heating energy required to cause melting and electromigration can be expressed as the programming current multiplied by a time. Increasing a programming current applied during programming can reduce a time required to form a void (e.g., a period of the first plateau 240). Increasing the programming current too much, however, can be detrimental. There exists a critical power above which cracks can form in structures surrounding the fuse because of a sudden change in temperature resulting from a high programming current (i.e., a high heating power).

The programming would be optimal if the programming period 213 was ended at the minimum time 251 because the post-trimmed resistance would be greatest. Achieving this may be difficult, however, for a few reasons. First, the time at which the programming current reaches a minimum may differ from fuse to fuse. Second, the programming current can be very small during the second plateau 250 making its detection difficult (e.g., because of noise). Third, the second plateau may only last a short time before the structure of the fuse begins to change again.

A small programming current can continue to flow during the second plateau 250 (e.g., through any remaining filaments not baked away). If the programming current is allowed to continue after the minimum time 251, the small remaining programming current may allow a back stress migration of the melted alloy to partially refill the void, which may in turn create further heating which may allow for further refilling of the void, and so on. This process can create a third transition 255 (i.e., rise) in the programming current. The third transition 255 is uncontrolled by the applied voltage. Accordingly, a rate at which the programming current increases during the third transition 255 can be highly variable. For example, in some fuse programming the void refilling process is not started and there is no significant third transition. In other fuse programming, the void refills quickly relative to the programming stop time 212. Accordingly, an end programming current 260 at a programming stop time 212 can be indeterminant and highly variable because of the uncontrolled nature of the third transition 255 (i.e., rise). In other words, the post-trimmed resistance may be any resistance in over a large (e.g., several orders of magnitude) range of resistances.

To obtain consistent post-trimmed resistances that are high (e.g., $\geq 1$ M$\Omega$), a closed-loop programming control for the programming circuit of FIG. 1 is disclosed herein. The closed loop programming control can adaptively end a programming period closer to the minimum time 251 (e.g., at the minimum time) and avoid this third transition 255. From a mechanical standpoint, the disclosed circuits and methods can produce a post-trimmed fuse structure having a well-defined void with few, if any, conductive filaments and without cracks in the structure. For example, the baking period may reduce a number of conductive filaments in and around the void.

Figure 3:
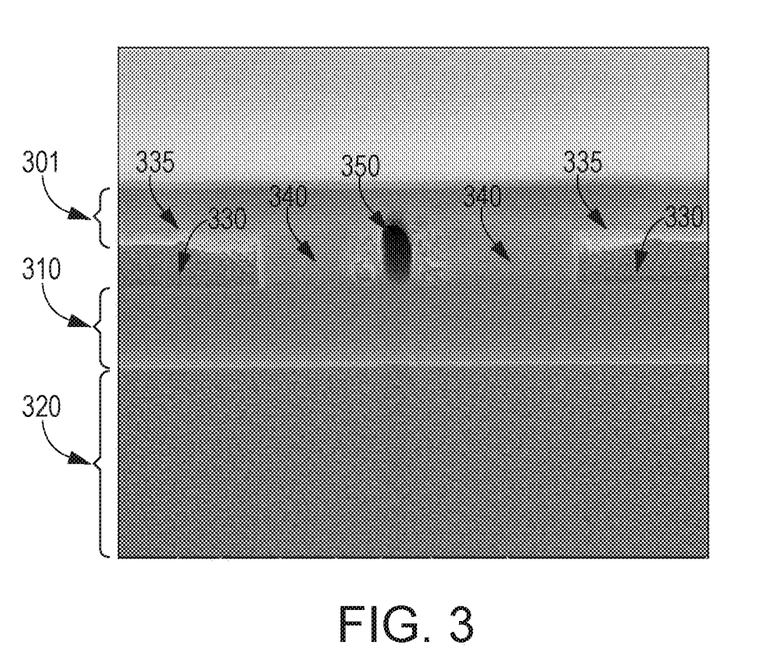
FIG. 3 is a cross section of a fuse after programming according to a possible implementation of the present disclosure

FIG. 3 is a cross section of a fuse after programming according to a possible implementation of the present disclosure. The fuse includes a substrate layer 320 that is contiguous with a field oxide layer 310. The fuse further includes a inter layer dielectric (ILD 301). Between the ILD 301 and the field oxide layer 310 is a layer of polysilicon 330 and a (thin) layer of silicide 335. Prior to programming, the polysilicon 330 and silicide 335 are continuous. After programming, the layers of polysilicon 330 and the silicide 335 are interrupted by amorphous silicon 340 and by a void 350, as shown in FIG. 3. The void 350 of the fuse shown is well defined with no filaments around the edges (e.g., top boundary or bottom boundary of the void 350 shown in FIG. 3) and shows no signs of back filling. These characteristics can indicate that the programming current was stopped after the void was formed, after the filaments were ablated (i.e., burned away, baked away), and before any refilling could occur. Additionally, no cracks are observable in the fuse structure, indicating that it is likely that the fuse did not experience excessive heating due to an overly long programming period (i.e., over trimming).

Figure 4:
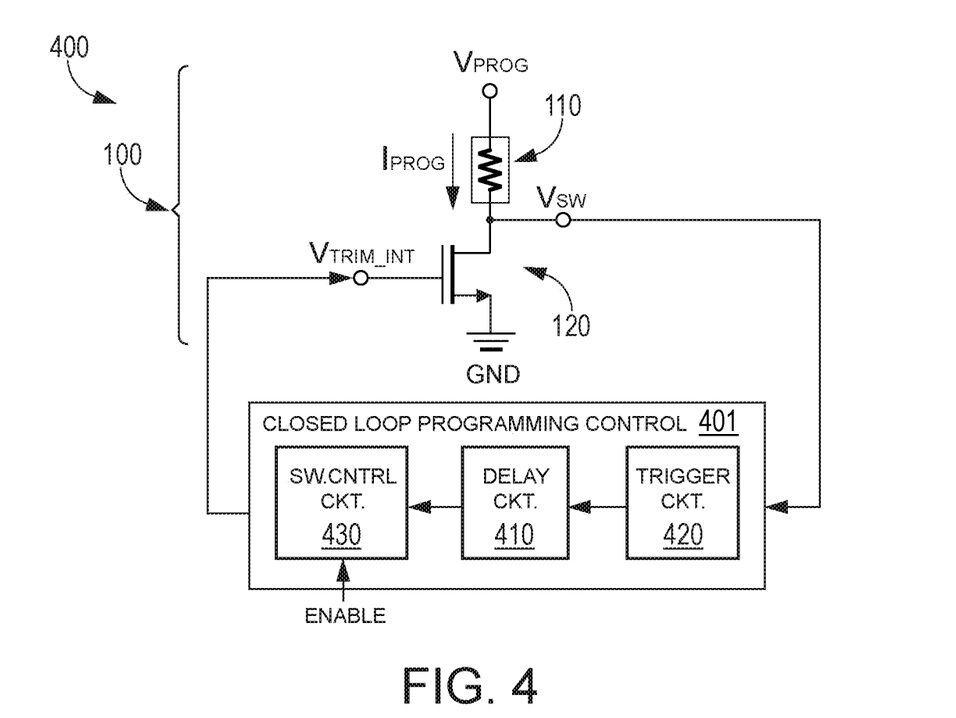
FIG. 4 is a schematic block diagram of a system for programming a fuse including a closed loop programming control circuit according to a possible implementation of the present disclosure.

FIG. 4 is schematic block diagram of a system for programming a fuse including a closed loop programming control circuit according to a possible implementation of the present disclosure. The programming system 400 (i.e., system) includes a closed loop programming control circuit with baking delay (i.e., closed loop programming control 401). The basic function of the closed loop programming control 401 can be described by referring again to the graphs shown in FIG. 2. The closed loop programming control 401 includes a trigger circuit 420 that is configured to detect a programming condition corresponding to the fuse. For example, the trigger circuit 420 can be configured to determine a time at which the programming current ($I_{PROG}$) reaches a current threshold 265. The current threshold 265 is set at a level that can be reliably measured. For example, by setting the current threshold 265 at a level higher than the minimum programming current (i.e., at a level higher than the second plateau 250) a complexity required for the trigger circuit to operate reliably can be reduced. The closed loop programming control 401 further includes a delay circuit (i.e., baking delay 410) that is configured to delay triggering the end of the programming period 213 by a baking period 270. In other words, the programming period 213 is extended past the trigger time by a delay period (i.e., baking period 270). The baking delay 410 may delay a trigger signal generated by the trigger circuit by a baking delay. The closed loop programming control 401 can further include a switch control circuit 430 that is configured to turn OFF the transistor 120 when a delayed trigger signal is received at the end of the baking period 270. The switch control circuit 430 may be further configured to turn ON the transistor 120 at the start of the programming period. For example, an enable signal (ENABLE, TRIM) may be supplied to the switch control circuit to begin the programming. The enable signal may also disable the programming after a period if no programming condition is detected.

This closed loop programming approach is based on the recognition that when the programming current reaches the current threshold 265, the fuse is likely in a state of the second transition 245. For example, it is likely that in this state, the void has just formed and most of the programming current is flowing through conductive filaments spanning edges of the newly formed void. The baking delay allows for the programming current to remain flowing for a period (i.e., baking period 270) that is long enough to ablate these conductive filaments and reach the second plateau 250 but not so long as to start a third transition 255 (i.e., refill the void).

The end of the baking period 270 may not precisely align the programming stop time 212 with the minimum programming current but can be sufficient to form a well-defined void (i.e., a high post-trimmed resistance). Additionally, the programming period 213 may be made shorter by the closed loop control so that damage to the fuse or surrounding structures is minimized or eliminated. Further, the baking period may be a fixed period but the programming period 213 resulting from the closed loop programming control may vary from fuse to fuse according to a particular response of each fuse to the programming current. In other words, the closed loop programming control is configured to automatically adapt to each fuse. This adaptability can help fuses of different technologies (e.g., feature sizes) utilize the same disclosed circuits and methods without change. Additionally, variations in the programming voltage ($V_{PROG}$) may be accommodated by the closed loop programming control automatically.

The baking delay may be short (e.g., 40 nanosecond (ns)) and may be determined and/or adjusted based on empirical programming results. For example, post-trimmed resistances of representative samples at various baking delays may be analyzed to determine a baking delay suitable for programming a particular fuse or fuse type. Additionally, or alternatively, the programming voltage may be determined and/or adjusted based on empirical programming results. For example, sets of fuses may be programmed using a variety of programming voltages and baking delays. After programming, the post-trimmed resistances for each fuse in a set may be compared to an acceptable range to determine a pass/fail total or pass/fail rate for each set. The pass/fail total/rate for the sets may be compared to determine an optimal programming voltage and baking delay (i.e., corresponding to the lowest fail total/rate). Empirical measurements to determine the programming voltage and/or the baking delay may be made as needed. For example, a particular fuse technology (e.g., 250 nm, 180 nm) may require an empirical determination of a programming voltage and a baking delay to be obtained once and then used for all subsequent programming of fuses having the particular fuse technology (e.g., 250 nm, 180 nm).

As shown in FIG. 4, the closed loop programming control 401 is configured to receive a switch voltage ($V_{SW}$) from the programming circuit at an input and configured to transmit a programming signal ($V_{TRIM\_INT}$) to the programming circuit at an output. The programming signal does not control the transistor 120 to set any particular programming current level but can simply turn the transistor ON or OFF so that the programming current can flow. When the transistor is ON, a particular level of the programming current is determined by the programing voltage ($V_{PROG}$) and by the resistance of the fuse. In other words, the programming current level is uncontrolled by the closed loop programming control 401.

Figure 5:
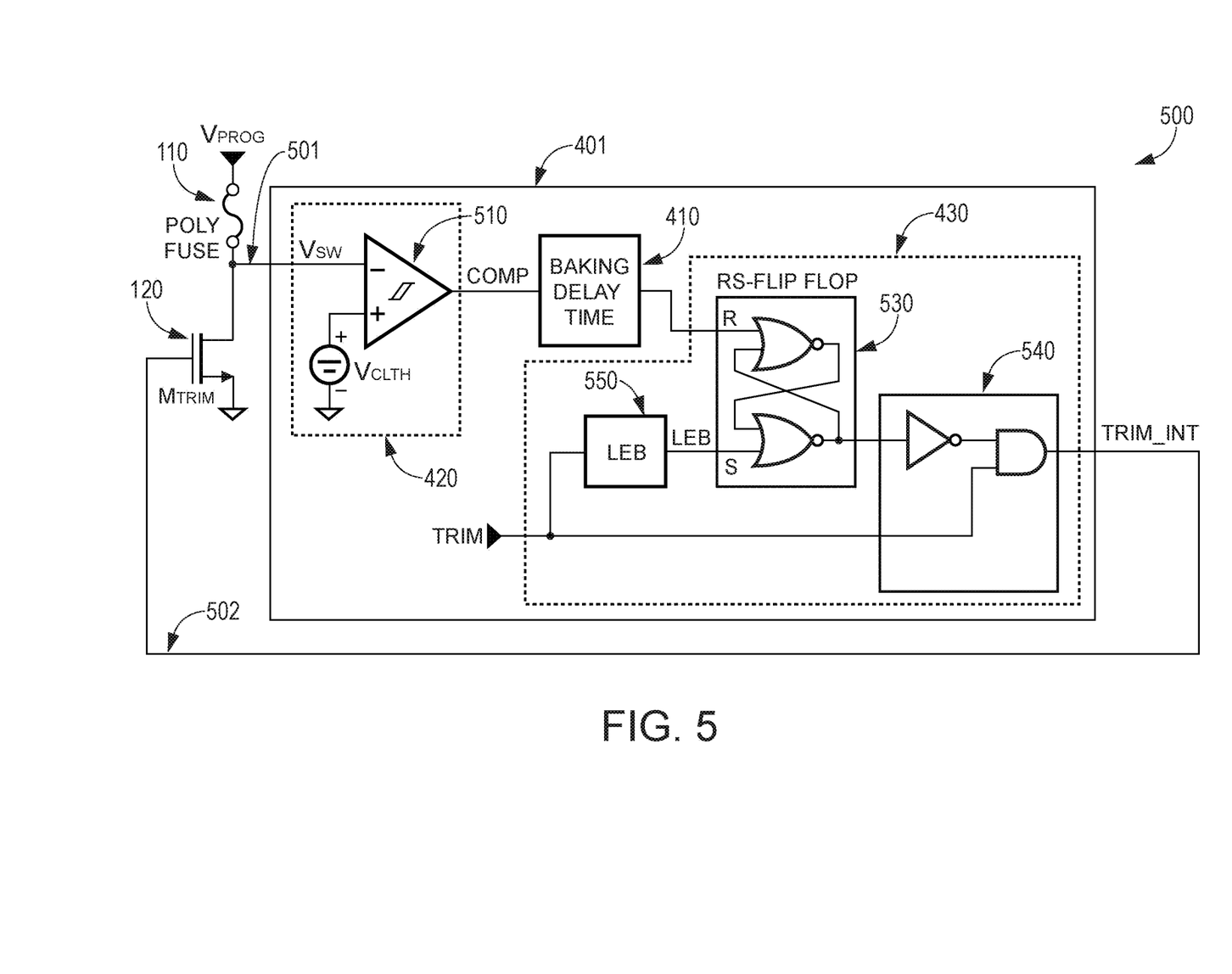
FIG. 5 is a detailed schematic of a system for programming a fuse illustrating a possible implementation of a closed loop programming circuit.

FIG. 5 is a detailed schematic of a programming system illustrating a possible implementation of the programming circuit and the closed loop programming control circuit. The system for programming a fuse (i.e., the programming system 500) includes a programming circuit that includes a fuse 110 and a transistor 120. The fuse 110 can be coupled on a first end (i.e., first side) to a programming voltage ($V_{PROG}$) and can be coupled on a second end (i.e., second side) to the transistor 120 (e.g., at a drain terminal of the transistor 120). The transistor 120 can be coupled at a terminal (e.g., source terminal) to a ground voltage (e.g., 0 V). The transistor 120 can be configured to conduct (i.e., ON) or to block (i.e., OFF) the flow of the programming current ($I_{PROG}$) through the fuse 110 by a programming voltage applied to a controlling terminal (e.g., a gate terminal) of the transistor 120.

The programming system further includes a closed loop programming control circuit 401. An input 501 of the closed loop programming control is coupled to the drain terminal of the transistor 120 for sensing a switch voltage ($V_{SW}$), which corresponds to the programming current. An output 502 of the closed loop programming control is coupled to the gate terminal of the transistor for turning the programming current ON or OFF. The closed loop programming control 401 is further configured to receive a trim enable signal (TRIM). The trim enable signal an be a digital signal and when the trim enable signal is a logical high level (i.e., HIGH), the trimming (i.e., the programming) of the fuse is enabled. For example, the programming voltage ($V_{PROG}$) may be active while the trim enable signal is HIGH. Additionally, the trim enable signal may set the initial states of logic circuits in the closed loop programming control circuit 401.

The trim enable signal is coupled to a set terminal of a latch circuit (e.g., RS flip-flop, SR latch) via a lead-edge blanking circuit (LEB circuit 550). The LEB circuit 550 is configured to prevent noise (e.g., glitches) from affecting the output of the latch circuit 530. The output of the LEB circuit 550 is coupled to a set gate (S) of the latch circuit 530 so that when the trim enable signal (TRIM) transitions from LOW to HIGH at the start of a programming period, the latch circuit 530 outputs a logical low (i.e., LOW). The LOW signal is transmitted to logic 540 that is configured to output a trim interval signal ($V_{TRIM\_INT}$) based on the output of the latch circuit 530 and the state of the trim enable signal. At the beginning of the programming period, the trim interval signal ($V_{TRIM\_INT}$) transitions from a LOW to HIGH and remains in this state until a high signal is received at a reset gate (R) of the latch circuit 530.

The closed loop programming control 401 further includes a comparison circuit (i.e., trigger circuit 420). The trigger circuit 420 includes a comparator 510 that is configured to compare a switch voltage ($V_{SW}$) from the drain terminal of the transistor (i.e., from a second end of the fuse)

to a closed-loop threshold voltage ($V_{CLTH}$) (i.e., threshold voltage) corresponding to the current threshold 265 described previously. The comparator is configured to output a comparison signal (i.e., trigger signal (COMP)). The trigger signal can be a digital signal with a logical level corresponding to the comparison. For example, when the switch voltage ($V_{SW}$) drops below the threshold voltage ($V_{CLTH}$) the trigger signal (COMP) may be a logical high (HIGH).

The closed loop programming control 401 further includes a delay circuit (i.e., baking delay 410) that is configured to delay the reset of the latch for a baking period after the voltage drop is detected. The duration of the delay corresponds to the baking period 270 described previously and shown in FIG. 2. When the output of the baking delay 410 transitions from LOW to HIGH then the latch circuit 530 output is reset from a LOW to a HIGH. The HIGH triggers the logic 540 to transition the trim interval signal ($V_{TRIM\_INT}$) from HIGH to LOW, turning OFF the programming current and ending the programming period 213.

The programming current can be terminated even while the trim enable signal is active (i.e., HIGH). A period of the trim enable signal can be set as the longest (i.e., maximum) programing period expected for a fuse or fuse type. Accordingly, if a switch voltage ($V_{SW}$) does not drop below the threshold voltage ($V_{CLTH}$) after the transistor 120 is enabled (i.e., turned ON), the programming period may not extend indefinitely, but rather is ended according to the maximum programming period of the trim enable signal.

Figure 6:
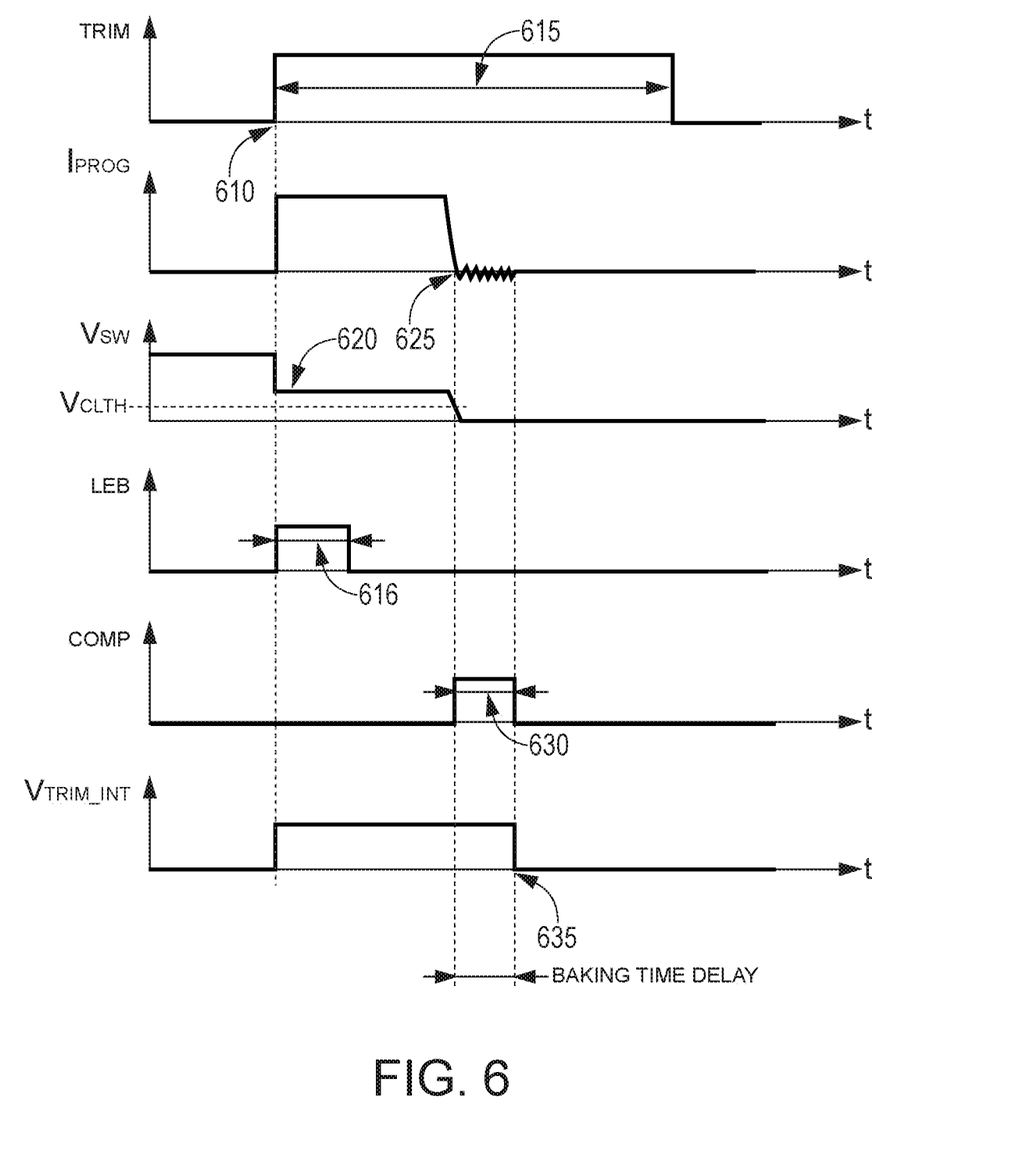
FIG. 6 are graphs showing signals from a closed loop programming control circuit according to a possible implementation of the present disclosure.

FIG. 6 are graphs showing signals from a closed-loop programming control circuit with baking delay, such as shown in FIG. 5. The graphs are all plotted according to a common time axis. As shown, a trim enable signal (TRIM) is activated to begin the programming at a start time 610. The trim enable signal can be configured to continue for the maximum programming period 615. The TRIM signal can be applied to a latch and logic to generate a ON transition in a trim interval signal ($V_{TRIM\_INT}$) at the start time 610. The trim interval signal ($V_{TRIM\_INT}$) can be applied to a programming circuit (e.g., a gate of the transistor of the programming circuit) to allow the programming current ($I_{PROG}$) to flow. The trim enable signal (TRIM) also activates a lead edge blanking signal (LEB), which is applied to a set terminal of a set-reset latch (i.e., SR latch) to set the SR latch and prevent any transition of the latch for a lead-edge-blanking period (i.e., LEB period 616). The LEB period 616 can be set as the minimum programing period expected for a fuse or fuse type. After the LEB signal sets the latch, the latch output can be held until it is reset. The SR latch (and logic) can control the transistor of the programming circuit so that when the SR latch is set to a set state, the transistor is turned ON; while the SR latch is held in the set state, the transistor remains ON; and when the SR latch is reset to a reset state, the transistor is turned OFF.

The programming current ($I_{PROG}$) causes the fuse to undergo a material change, which causes a switch voltage ($V_{SW}$) of the programming circuit to drop to a first plateau 620. As the programming current ($I_{PROG}$) continues, a void in the fuse is formed at a void formation time 625, which resists the programming current. At the void formation time 625, the programming current is reduced quickly. The void formation causes the switch voltage ($V_{SW}$) to drop below a threshold level (i.e., the closed loop threshold voltage ($V_{CLT}H$)), triggering the trigger signal (i.e., COMP) to transition. The trigger signal (i.e., COMP) is held by a baking delay for a baking period 630 to allow the void time to form. In other words, the baking period 630 extends the programming period after the void formation time 625 to allow the fuse resistance to increase closer to a maximum level (e.g., ≥1 MΩ). After the baking period 630, the COMP signal configures the SR latch and logic to generate an OFF transition in a trim interval signal ($V_{TRIM\_INT}$) at an end time (i.e. stop time 635). At the stop time 635, the programming current ($I_{PROG}$) is turned OFF and the fuse is allowed to cool and solidify as a blown fuse. The trim enable signal (TRIM) can continue after the stop time 635 without altering the fuse. The trim enable signal (TRIM) may configured the fuse circuit in a programming state to program (i.e., write) the fuse. The fuse may include circuitry for programming, as well as for reading.

Figure 7:
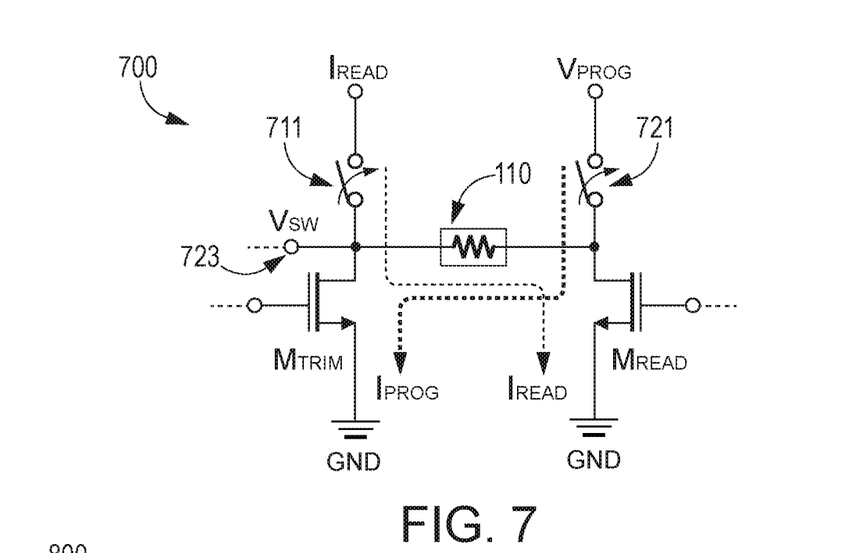
FIG. 7 is a schematic of a portion of a read/write circuit for a fuse according to a possible implementation of the present disclosure.

FIG. 7 is a schematic of a portion of a read-write circuit for a fuse according to a possible implementation of the present disclosure. The read-write circuit 700 includes a program (i.e., write) switch 721 and a read switch 711. The program switch 721 and the read switch 711 can configured the read-write circuit 700 in a programming mode for programming a fuse 110, as discussed. Alternatively, the program switch 721 and the read switch 711 can configure the read-write circuit 700 in a read mode for reading the fuse 110 (e.g., after programming). Reading the fuse may include determining if the fuse has a low resistance (i.e., is not blown) or has a high resistance (i.e., is blown).

The read-write circuit 700 can be configured into a program (i.e., write) mode by closing the program switch 721 and opening the read switch 711. When the program voltage ($V_{PROG}$) is coupled to the read-write circuit 700 by a closed program switch 721, a trim transistor ($M_{TRIM}$) can be configured to conduct so that a programming current ($I_{PROG}$) (e.g., 40 mA) can flow through the fuse 110. As discussed, the programming of the fuse 110 may be determined based on a switch voltage ($V_{SW}$) sensed at a sense node 723 of the read-write circuit 700.

The read-write circuit 700 can be configured into a sense (i.e., read) mode by opening the program switch 721 and closing the read switch 711. A read transistor ($M_{READ}$) can be configured to conduct (i.e., turned ON) so that a read current ($I_{READ}$) supplied to the read-write circuit can flow through the fuse 110. The reading of the fuse 110 may be determined based on the switch voltage ($V_{SW}$) sensed at the sense node 723 of the read-write circuit 700.

In one possible implementation provided here to help understanding, an unblown fuse has an unprogrammed (i.e., unblown) resistance of 50Ω and a programmed (i.e., blown) resistance of 1 MΩ. To read the fuse, a current source may supply a read current ($I_{READ}$) of 1 μA to the fuse through a read transistor ($M_{READ}$) having a 100Ω resistance in an ON condition. The resistance of the fuse may correspond to a switch voltage ($V_{SW}$) measured at the sense node 723 of the read-write circuit 700. In an unblown (i.e., not trimmed) condition, the switch voltage is determined as the read current multiplied by the resistance of the unblown fuse and the read transistor in the ON condition, which in this case is $V_{SW}$=150 μV (i.e., 1 μA*(50Ω+100Ω)). In a blown (i.e., trimmed) condition, the switch voltage is determined as the read current multiplied by the resistance of the blown fuse and the read transistor in the ON condition, which in this case is $V_{SW}$≈1V (i.e., 1 μA*(1 MΩ+100Ω)). The state of fuse programming can be determined by comparing the measured switch voltage to a threshold set within a voltage range between the relatively high (i.e., HIGH) switch voltage of the blown fuse and the relatively low (i.e., LOW) switch voltage of the not blown fuse.

The configuration of the read-write circuit 700 allows for the switch voltage ($V_{SW}$) to be sensed (i.e., measured)

relative to the ground voltage (GND). In other words, it is not necessary to determine a floating voltage (e.g., a voltage drop across the fuse). Additionally, the configuration provides a large range between switch voltages for a programmed fuse and an unprogrammed fuse. These characteristics can increase reliability of fuse programming/reading and allow for low voltages (e.g., <4 volts) and low power devices (e.g., transistors) to be used in the read-write circuit.

The disclosed circuits and techniques may be used to provide high resistance (e.g., ≥1 MΩ) and repeatable programming of fuses in low voltage (e.g., <5V) circuits. The programming of the disclosed approach may be faster than other approaches because of the adaptable programming period. For example, a programming period may be defined by a "short pulse" having a programming period in range of 100-500 nanoseconds (ns) instead of a "long pulse" having a period of greater than or equal to 1 μs. The programming period is adaptable to a fuse because it depends on a length of time necessary for the void in the fuse to form. The baking period is a fixed amount of time after a void has formed for the programming to continue. The baking period may be less than 100 ns (e.g., 10 ns). The programming current of the disclosed approach may be higher than other approaches. For example, a "high current level" in a range of greater than or equal to 30 mA may be used instead of a "low current level" in a range of less than 30 mA. These values are representative, the disclosed approach is not limited to any particular programming voltage or current levels because a physical state of the fuse is monitored and used to determine when programming should end. As a result, programming voltages can be increased without damaging the fuse structure.

Figure 8:
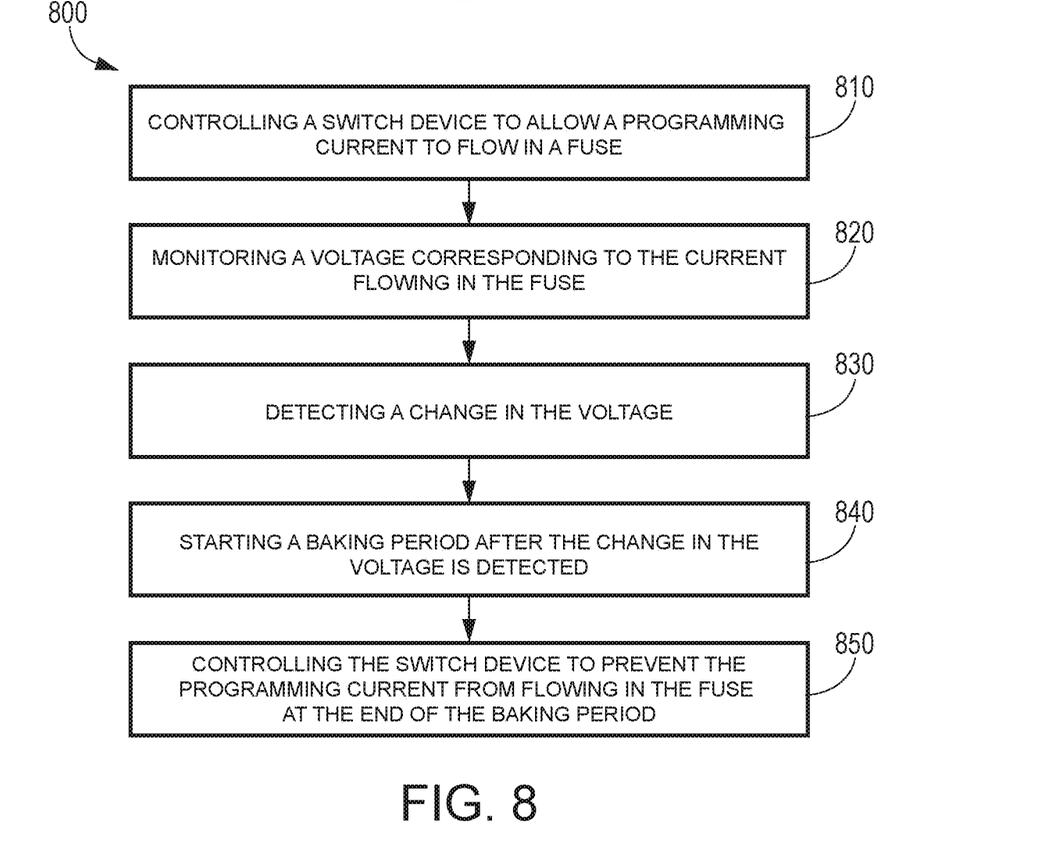
FIG. 8 is a flowchart of a method for programming a fuse according to a possible implementation of the present disclosure.

FIG. 8 is a flowchart of a method for programming a fuse according to a possible implementation of the present disclosure. The method 800 includes controlling 810 a switched device (e.g., a transistor) to allow (e.g., to conduct) a programming current to flow in a fuse. The method further includes monitoring a voltage corresponding to the current flowing in the fuse. For example, a voltage at a terminal of the fuse may be sensed as an indicator of the current flowing in the fuse. The method further includes detecting 830 a change in the voltage. For example, a voltage drop below a threshold may be detected, and this voltage drop may indicate a void forming in the fuse. The method further includes starting 840 a baking period after the change in the voltage is detected. For example, after it is determined that a void is forming in the fuse, the programming current may be allowed to continue to flow for a baking period to continue the fuse formation. By adding a fixed amount of time to the programming after the void formation the resistance provided by the void can be increased without increasing the complexity of the circuitry required to determine a maximum programmed resistance. The method further includes controlling the switch device to prevent the programming current from flowing through the fuse at the end of the baking period. For example, the baking period can force the programming to end before the void can refill due to overheating.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A method for programming a fuse, the method comprising:
controlling a switch device to begin a programming period by allowing a programming current to flow in a fuse;
monitoring a voltage corresponding to the programming current flowing in the fuse;
detecting a change in the voltage;
starting a baking period after the change in the voltage is detected; and
controlling, after the baking period, the switch device to end the programming period by substantially blocking the programming current.

2. The method for programming a fuse according to claim 1 wherein at a start of the baking period the fuse has a first resistance and at an end of the baking period the fuse has a second resistance, the second resistance higher than the first resistance.

3. The method for programming a fuse according to claim 1 wherein the detecting the change in the voltage includes:
detecting when the voltage drops below a threshold voltage as a time corresponding to a formation of a void in the fuse.

4. The method for programming a fuse according to claim 3, wherein the programming period varies from fuse to fuse according to the formation of the void in the fuse.

5. The method for programming a fuse according to claim 3, wherein at a start of the baking period, a first number of conductive filaments span the void and at an end of the baking period a second number of conductive filaments span the void, the second number of conductive filaments less than the first number of conductive filaments.

6. The method for programming a fuse according to claim 1, wherein the baking period is less than 100 nanoseconds.

7. The method for programming a fuse according to claim 1, wherein the fuse is substantially polysilicon at a start of the programming period and is substantially amorphous silicon and includes a void at an end of the programming period.

8. The method for programming a fuse according to claim 1, wherein at an end of the programming period the fuse has a post-trimmed resistance of greater than or equal to 1 mega-Ohm.

9. The method for programming a fuse according to claim 1, wherein the baking period is a fixed period that does not change for each fuse programmed and the programming period is adaptable and can change for each fuse programmed.

10. A system for programming a fuse, the system comprising:
a fuse coupled to a programming voltage at a first end and to a transistor at a second end, the transistor switched to an ON condition to start a programming period, during which a programming current is allowed by the transistor to flow through the fuse; and
a closed loop programming control circuit coupled at an input to the second end of the fuse and at an output to a controlling terminal of the transistor, the closed loop programming control circuit including:
a trigger circuit configured to generate a trigger signal upon detecting a programming condition corresponding to the fuse at the input;
a delay circuit configured to delay the trigger signal from the trigger circuit for a baking period; and
a switch control circuit configured to receive a delayed trigger signal from the delay circuit, and upon receiving the delayed trigger signal, switching the transistor to an OFF condition to end the programming period.

11. The system for programming a fuse according to claim 10, wherein the programming condition corresponds to a drop in a voltage at the second end of the fuse.

12. The system for programming a fuse according to claim 11, wherein the drop in the voltage at the second end of the fuse corresponds to a formation of a void in the fuse.

13. The system for programming the fuse according to claim 12, wherein the programming period is variable and depends on a length of time necessary for the void in the fuse to form.

14. The system for programming a fuse according to claim 10, wherein the switch control circuit includes a set-reset latch.

15. The system for programming a fuse according to claim 14, wherein the set-reset latch is configured to receive a trim enable signal at a set terminal and the delayed trigger signal at a reset terminal, the set-reset latch configured to configure the transistor in the ON condition when set and configure the transistor in the OFF condition when reset.

16. The system for programming a fuse according to claim 15, wherein the switch control circuit further includes a lead edge blanking circuit (LEB circuit) coupled to the set terminal of the set-reset latch, the LEB circuit configured to prevent the set-reset latch from being reset for a lead-edge-blanking period (LEB period) after being set.

17. The system for programming the fuse according to claim 10, wherein the trigger circuit includes a comparator configured to compare a voltage at the second end of the fuse to a threshold voltage.

18. A closed loop programming control circuit comprising:
a trigger circuit configured to receive a voltage from a fuse during programming and generate a trigger signal upon detecting a drop in the voltage from the fuse during programming to below a threshold level;
a delay circuit configured to delay the trigger signal from the trigger circuit for a baking period; and
a switch control circuit configured to receive a delayed trigger signal from the delay circuit, and upon receiving the delayed trigger signal, transmitting a signal to end programming of the fuse.

19. The closed loop programming control circuit according to claim 18 wherein the drop in the voltage from the fuse being programmed corresponds to an increase in a resistance of the fuse being programmed.

20. The closed loop programming control circuit according to claim 19, wherein the resistance of the fuse being programmed further increases during the baking period to a resistance greater than one mega-ohm.

* * * * *